(12) United States Patent
Song et al.

(10) Patent No.: US 8,130,034 B2
(45) Date of Patent: Mar. 6, 2012

(54) RAIL-TO-RAIL AMPLIFIER

(75) Inventors: Taek-Sang Song, Gyeonggi-do (KR);
Dae-Han Kwon, Gyeouggi-do (KR);
Jun-Woo Lee, Gyeonggi-do (KR)

(73) Assignee: Hynix Semiconductor Inc.,
Gyeonggi-do (KR)

( * ) Notice: Subject to any disclaimer, the term of this patent is extended or adjusted under 35 U.S.C. 154(b) by 0 days.

(21) Appl. No.: 12/833,154

(22) Filed: Jul. 9, 2010

(65) Prior Publication Data

US 2011/0291759 A1    Dec. 1, 2011

(30) Foreign Application Priority Data

Jun. 1, 2010 (KR) .................. 10-2010-0051708

(51) Int. Cl.
*H03F 3/45* (2006.01)

(52) U.S. Cl. .................................. 330/253; 330/261

(58) Field of Classification Search .................. 330/253, 330/255, 257, 261
See application file for complete search history.

(56) References Cited

U.S. PATENT DOCUMENTS

| 5,610,557 | A * | 3/1997 | Jett, Jr. ...................... | 330/261 |
| 6,614,302 | B2 * | 9/2003 | Abe ........................... | 330/253 |
| 6,696,894 | B1 * | 2/2004 | Huang ....................... | 330/253 |
| 7,126,596 | B1 | 10/2006 | Hogan | |

FOREIGN PATENT DOCUMENTS

| KR | 1020090041330 | 4/2009 |
| KR | 1020100090378 | 8/2010 |
| KR | 1020100123394 | 11/2010 |

OTHER PUBLICATIONS

Notice of Preliminary Rejection issued from Korean Intellectual Property Office on Jun. 7, 2011.
Notice of Allowance issued by the Korean Intellectual Property Office on Dec. 6, 2011.

* cited by examiner

*Primary Examiner* — Khanh Nguyen
(74) *Attorney, Agent, or Firm* — IP & T Group LLP

(57) ABSTRACT

A rail-to-rail amplifier includes an NMOS type amplification unit configured to perform an amplification operation on differential input signals in a domain in which DC levels of the differential input signals are higher than a first threshold value, a PMOS type folded-cascode amplification unit configured to perform an amplification operation on the differential input signals in a domain in which the DC levels of the differential input signals are lower than a second threshold value which is higher than the first threshold value, the PMOS type folded-cascode amplification unit being cascade-coupled to the NMOS type amplification unit, and an adaptive biasing unit configured to interrupt a current path of the PMOS type folded-cascode amplification unit in a domain in which the DC levels of the differential input signals are higher than the second threshold value in response to the differential input signals.

22 Claims, 7 Drawing Sheets

RAIL-TO-RAIL AMPLIFIER

CROSS-REFERENCE TO RELATED APPLICATIONS

The present application claims priority of Korean Patent Application No. 10-2010-0051708, filed on Jun. 1, 2010, which is incorporated herein by reference in its entirety.

BACKGROUND OF THE INVENTION

Exemplary embodiments of the present invention relate to a semiconductor design technology, and more particularly, to a rail-to-rail amplifier.

In general, a technology for a low voltage operation is desirable in a semiconductor technology. However, as an operation voltage is reduced, the swing range of a signal inputted to a semiconductor device is also narrowed. In this regard, many technologies have been developed to overcome concerns caused by the narrowed swing range of the input signal. A rail-to-rail amplifier is one of representative devices used for a low voltage operation.

In the rail-to-rail amplifier, differential input signals are applied to both a pair of NMOS transistors and a pair of PMOS transistors, unlike an operational amplifier in which differential input signals are applied to either a pair of NMOS transistors or a pair of PMOS transistors. The differential input signal may have all values in an allowable range of input voltages of the rail-to-rail amplifier in and around a common-mode voltage level. The common-mode voltage level represents a DC level at the crossing point of the differential input signals.

FIG. 1 is an internal configuration diagram of a conventional rail-to-rail amplifier.

Referring to FIG. 1, the rail-to-rail amplifier 100 includes an NMOS type amplification unit 110, a PMOS type folded-cascode amplification unit 120, and a biasing unit 130. The NMOS type amplification unit 110 receives differential input signals VIN and VINB and performs an amplification operation in a domain in which the DC levels of the differential input signals VIN and VINB are higher than a first threshold value V1. The PMOS type folded-cascode amplification unit 120 receives the differential input signals VIN and VINB and performs an amplification operation in a domain in which the DC levels of the differential input signals VIN and VINB are lower than a second threshold value V2 which is higher than the first threshold value V1. The PMOS type folded-cascode amplification unit 120 is cascade-coupled to the NMOS type amplification unit 110. The biasing unit 130 applies a first bias signal VBIAS1 and a second bias signal VBIAS2 to the PMOS type folded-cascode amplification unit 120. The NMOS type amplification unit 110 and the PMOS type folded-cascode amplification unit 120 may share one loading section A.

The operation of the conventional rail-to-rail amplifier 100 of FIG. 1 is described below. In the rail-to-rail amplifier 100, when the DC levels of the differential input signals VIN and VINB are lower than the first threshold value V1 in an allowable input voltage range of the rail-to-rail amplifier 100, only the PMOS type folded-cascode amplification unit 120 performs the amplification operation. When the DC levels of the differential input signals VIN and VINB are higher than the first threshold value V1 and lower than the second threshold value V2 in the allowable range of the rail-to-rail amplifier 100, both the NMOS type amplification unit 110 and the PMOS type folded-cascode amplification unit 120 perform the amplification operation. When the DC levels of the differential input signals VIN and VINB are higher than the second threshold value V2 in the allowable range of the rail-to-rail amplifier 100, only the NMOS type amplification unit 110 performs the amplification operation.

FIG. 2 is an internal configuration diagram of another conventional rail-to-rail amplifier.

The rail-to-rail amplifier 200 of FIG. 2 includes amplification units having an opposite type as compared with the rail-to-rail amplifier of FIG. 1.

Referring to FIG. 2, the rail-to-rail amplifier 200 includes a PMOS type amplification unit 210, an NMOS type folded-cascode amplification unit 220, and a biasing unit 230. The PMOS type amplification unit 210 receives differential input signals VIN and VINB and performs an amplification operation in a domain in which the DC levels of the differential input signals VIN and VINB are lower than a first threshold value V1. The NMOS type folded-cascode amplification unit 220 receives the differential input signals VIN and VINB and performs an amplification operation in a domain in which the DC levels of the differential input signals VIN and VINB are higher than a second threshold value V2 which is lower than the first threshold value V1. The NMOS type folded-cascode amplification unit 220 is cascade-coupled to the PMOS type amplification unit 210. The biasing unit 230 applies a first bias signal VBIAS1 and a second bias signal VBIAS2 to the NMOS type folded-cascode amplification unit 220. The PMOS type amplification unit 210 and the NMOS type folded-cascode amplification unit 220 may share one loading section B.

The operation of the conventional rail-to-rail amplifier 200 of FIG. 2 is described below.

In the rail-to-rail amplifier 200, when the DC levels of the differential input signals VIN and VINB are equal to or less than the second threshold value V2, only the PMOS type amplification unit 210 performs the amplification operation. When the DC levels of the differential input signals VIN and VINB are between the first threshold value V1 and the second threshold value V2, both the PMOS type amplification unit 210 and the NMOS type folded-cascode amplification unit 220 perform the amplification operation. When the DC levels of the differential input signals VIN and VINB are equal to or more than the first threshold value V1, for example, only the NMOS type folded-cascode amplification unit 220 performs the amplification operation.

However, the above-described rail-to-rail amplifiers 100 and 200 have the following concerns.

FIG. 3 is a graph illustrating the current-voltage characteristics and the voltage gain of the rail-to-rail amplifier 100 of FIG. 1 according to the DC levels of the differential input signals, and FIG. 4 is a graph illustrating the current-voltage characteristics and the voltage gain of the rail-to-rail amplifier 200 of FIG. 2 according to the DC levels of the differential input signals.

Referring to FIG. 3, a constant amount of bias current 2xICAS flows through a sinking section N4 and N5 of the PMOS type folded-cascode amplification unit 120 regardless of the DC levels of the differential input signals VIN and VINB. This is because the second bias signal VBIAS2 applied to the sinking section N4 and N5 is constant. Consequently, since the bias current 2xICAS flowing through the sinking section N4 and N5 maintains a constant value regardless of the differential input signals VIN and VINB, it can be understood that a bias current 2xILOAD of a common loading section A and a bias current ICS_P of a sourcing section P3 included in the PMOS type folded-cascode amplification unit 120 are complementary to each other. That is, a reduction in one of the bias current 2xILOAD and the bias current ICS_P causes an increase in the other one thereof (2xICAS=2xILOAD+ICS_P).

When the DC levels of the differential input signals VIN and VINB are equal to or less than the first threshold value V1, the amount of the bias current 2xILOAD flowing through the common loading section A has a tendency to be constant. Thus, since an output resistance of the common loading section A is constantly maintained, the voltage gain Av of the rail-to-rail amplifier 100 is constantly maintained. Meanwhile, when the DC levels of the differential input signals VIN and VINB are equal to or more than the first threshold value V1, the amount of the bias current 2xILOAD flowing through the common loading section A has a tendency to be increased. This is because the first bias signal VBIAS1 and the second bias signal VBIAS2 are constantly applied to the PMOS type folded-cascade amplification unit 120, and the sourcing section P3 and the sinking section N4 and N5 continue to be in an enabled state regardless of the differential input signals VIN and VINB. Thus, the output resistance of the common loading section A is gradually reduced, resulting in the reduction in the voltage gain Av of the rail-to-rail amplifier 100. Meanwhile, when the DC levels of the differential input signals VIN and VINB are equal to or more than the second threshold value V2, only the NMOS type amplification unit 110 performs the amplification operation. In such a case, the voltage gain Av of the rail-to-rail amplifier 100 is minimized. That is, when the NMOS type amplification unit 110 performs the amplification operation according to the DC levels of the differential input signals VIN and VINB, an unnecessary current path P1 may be formed (see FIG. 1), resulting in a negative influence on the voltage gain Av of the rail-to-rail amplifier 100.

Referring to FIG. 4, when the rail-to-rail amplifier 200 of FIG. 2 performs the amplification operation, the amount of the bias current 2xICAS flowing through a second sourcing section P14 and P15 is the same as the sum of a bias current ICS_N flowing through a first sinking section N15 and a bias current 2xILOAD flowing through a common loading section B (2xICAS=ICS_N+2xILOAD).

When the DC levels of the differential input signals VIN and VINB are equal to or less than the first threshold value V1, the amount of the bias current 2xILOAD flowing through the common loading section B may be higher than a desired current amount. This is because the second sourcing section P14 and P15 continue to be enabled by the second bias signal VBIAS2 regardless of the differential input signals VIN and VINB, and an unnecessary current is introduced to the common loading section B. In other words, an unnecessary current path P2 may be formed when the PMOS type amplification unit 210 performs the amplification operation (see FIG. 2), resulting in the reduction in the voltage gain Av of the rail-to-rail amplifier 200.

SUMMARY OF THE INVENTION

Exemplary embodiments of the present invention are directed to provide a rail-to-rail amplifier with a constant voltage gain regardless of the DC levels of differential input signals.

In accordance with an exemplary embodiment of the present invention, a rail-to-rail amplifier includes a first amplification unit configured to perform an amplification operation on differential input signals in a domain in which DC levels of the differential input signals are higher than a first threshold value, a second amplification unit configured to perform an amplification operation on the differential input signals in a domain in which the DC levels of the differential input signals are lower than a second threshold value which is higher than the first threshold value, the second amplification unit being cascade-coupled to the first amplification unit, and an adaptive biasing unit configured to interrupt a current path of the second amplification unit in a domain in which the DC levels of the differential input signal are higher than the second threshold value.

In accordance with another exemplary embodiment of the present invention, a rail-to-rail amplifier includes a first amplification unit configured to perform an amplification operation on differential input signals in a domain in which DC levels of the differential input signals are lower than a first threshold value, a second amplification unit configured to perform an amplification operation on the differential input signals in a domain in which the DC levels of the differential input signals are higher than a second threshold value which is lower than the first threshold value, the second amplification unit being cascade-coupled to the first amplification unit, and an adaptive biasing unit configured to interrupt a current path of the second amplification unit in a domain in which the DC levels of the differential input signal are lower than the second threshold value.

DESCRIPTION OF SPECIFIC EMBODIMENTS

Figure 1:
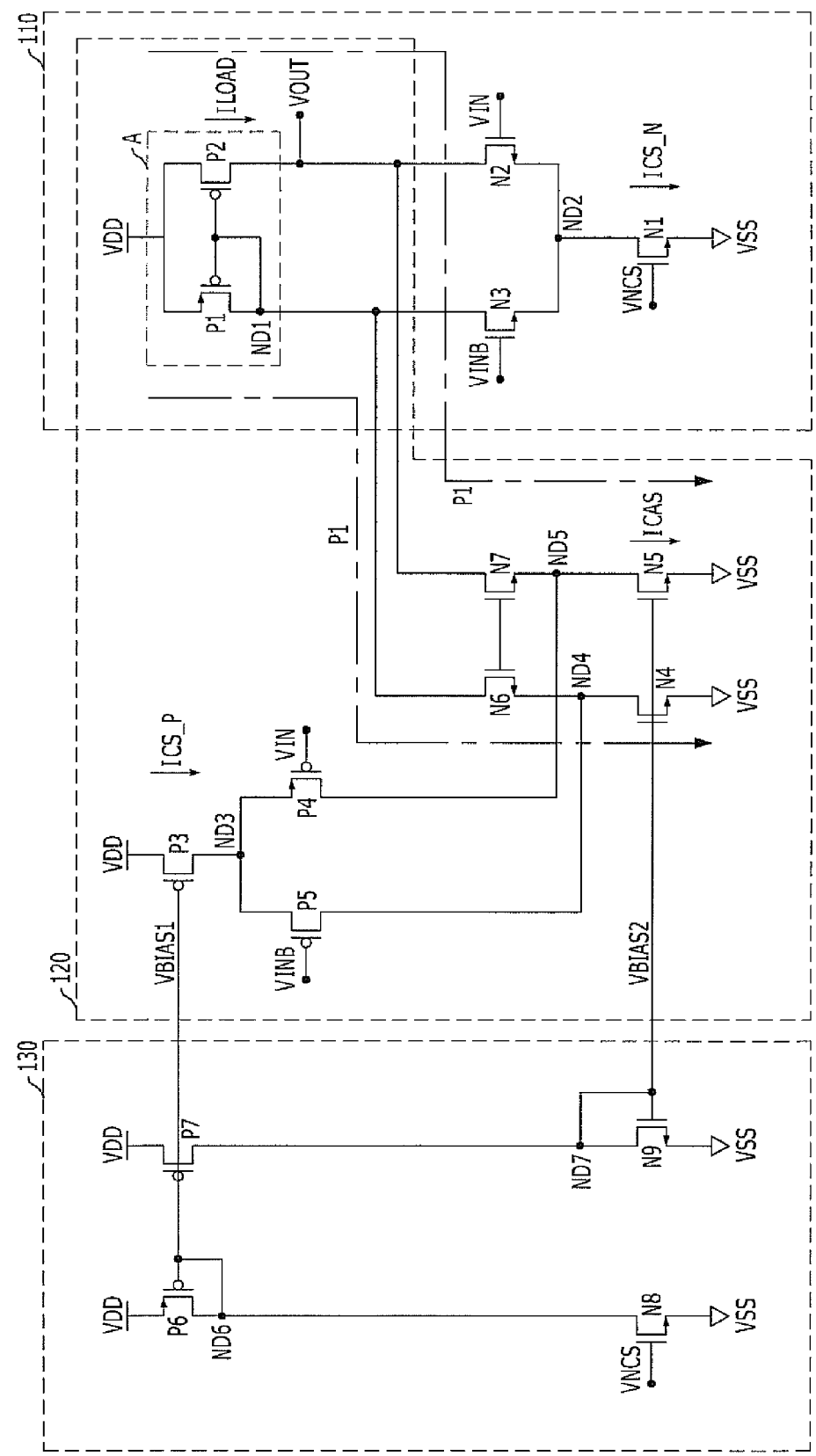
FIG. 1 is an internal configuration diagram of a conventional rail-to-rail amplifier.
Figure 2:
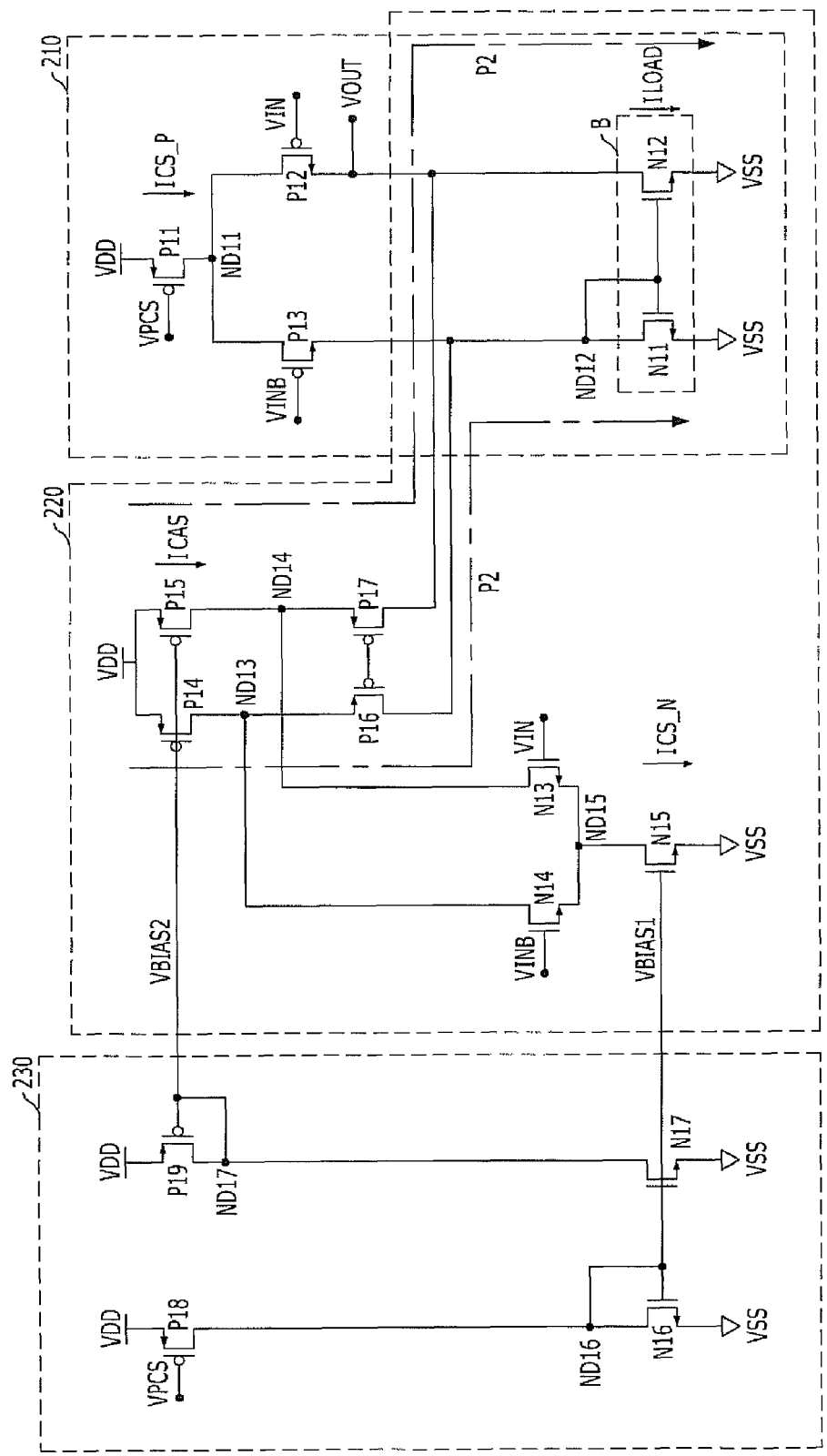
FIG. 2 is an internal configuration diagram of another conventional rail-to-rail amplifier.
Figure 3:
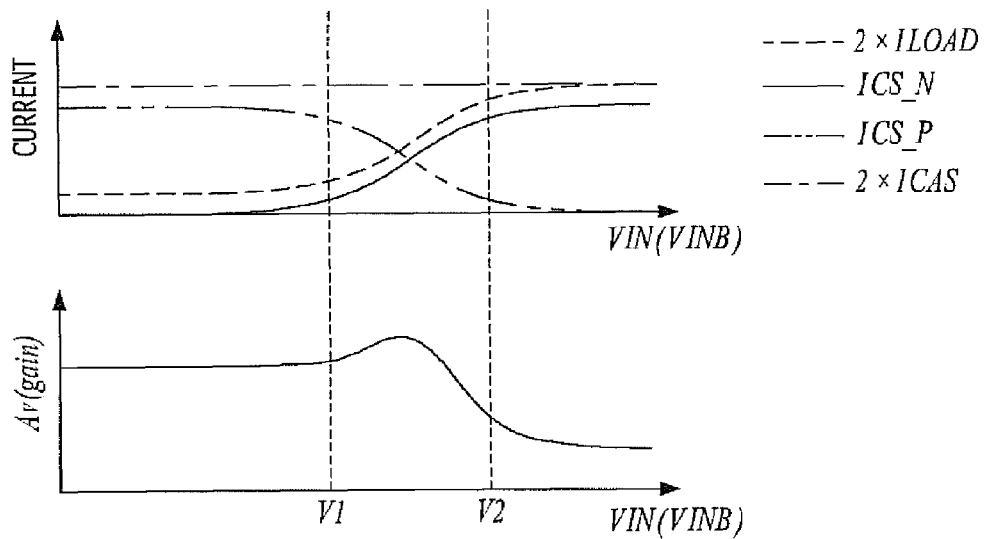
FIG. 3 is a graph illustrating the current-voltage characteristics and the voltage gain of the rail-to-rail amplifier of FIG. 1 according to the DC levels of differential input signals.
Figure 4:
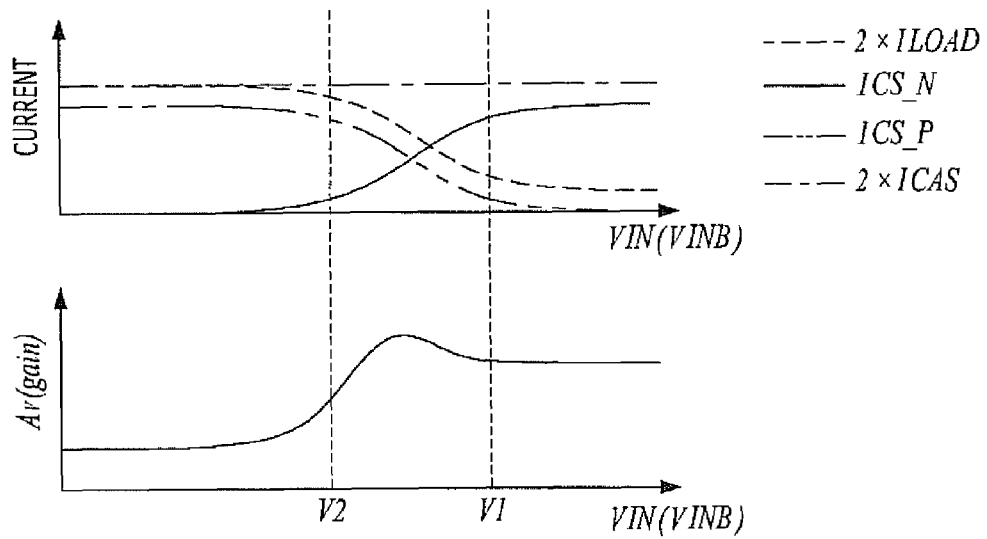
FIG. 4 is a graph illustrating the current-voltage characteristics and the voltage gain of the rail-to-rail amplifier of FIG. 2 according to the DC levels of differential input signals.

Exemplary embodiments of the present invention will be described below in more detail with reference to the accompanying drawings. The present invention may, however, be embodied in different forms and should not be construed as limited to the embodiments set forth herein. Rather, these embodiments are provided so that this disclosure will be thorough and complete, and will fully convey the scope of the present invention to those skilled in the art. Throughout the disclosure, like reference numerals refer to like parts throughout the various figures and embodiments of the present invention.

Figure 5:
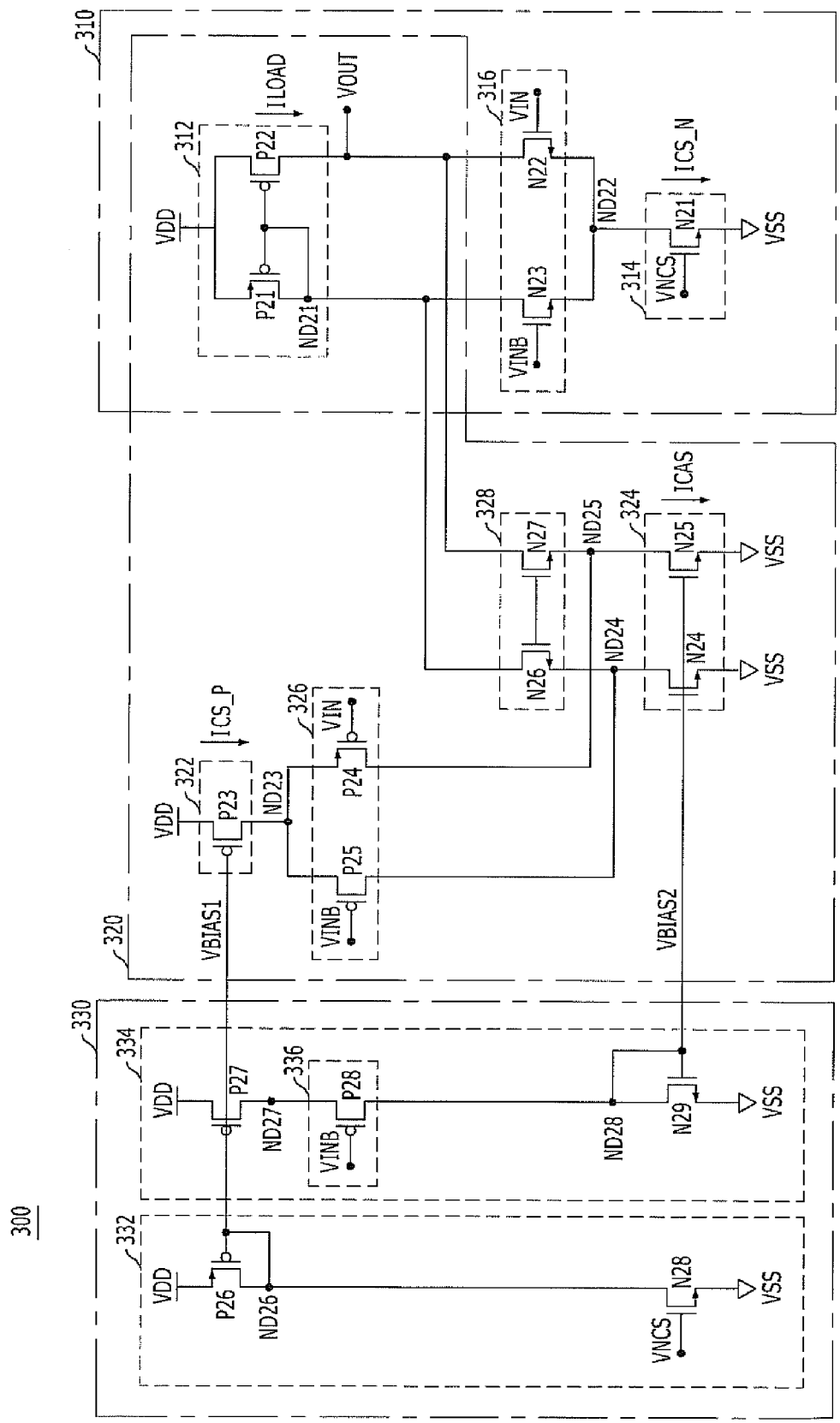
FIG. 5 is an internal circuit diagram of a rail-to-rail amplifier in accordance with an exemplary embodiment of the present invention.

FIG. 5 is an internal circuit diagram of a rail-to-rail amplifier in accordance with an exemplary embodiment of the present invention.

Referring to FIG. 5, the rail-to-rail amplifier 300 includes an NMOS type amplification unit 310, a PMOS type folded-cascode amplification unit 320, and an adaptive biasing unit 330. The NMOS type amplification unit 310 is configured to receive differential input signals VIN and VINB and perform an amplification operation in a domain in which the DC levels of the differential input signals VIN and VINB are higher than a first threshold value V1. The PMOS type folded-cascode amplification unit 320 is configured to receive the differential input signals VIN and VINB and perform an amplification operation in a domain in which the DC levels of the differential input signals VIN and VINB are lower than a second threshold value V2 which is higher than the first threshold value V1. The PMOS type folded-cascode amplification unit 320 is cascade-coupled to the NMOS type amplification unit 110. The adaptive biasing unit 330 is configured to interrupt/block a current path of the PMOS type folded-cascode amplification unit 320 in a domain in which the DC levels of the differential input signals VIN and VINB are higher than the second threshold value V2 in response to the differential input signals VIN and VINB.

The NMOS type amplification unit 310 includes a common loading section 312 for sourcing/supplying a first bias current 2xILOAD, a first sinking section 314 for sinking/grounding a second bias current ICS_N in response to a source bias signal VNCS, and a first differential input section 316 provided between the common loading section 312 and the first sinking section 314 to receive the differential input signals VIN and VINB.

The common loading section 312 includes first and second PMOS transistors P21 and P22 forming a current mirror. In detail, the first PMOS transistor P21 has a gate coupled to a first node ND21 and a source-drain path between a supply voltage (VDD) terminal and the first node ND21, and the second PMOS transistor P22 forms a common gate together with the first PMOS transistor P21 and has a source-drain path between the supply voltage (VDD) terminal and an output terminal VOUT.

The first sinking section 314 includes a first NMOS transistor N21 which has a gate for receiving the source bias signal VNCS and a source-drain path between a second node ND22 and a ground voltage (VSS) terminal.

The first differential input section 316 includes a second NMOS transistor N22 and a third NMOS transistor N23. The second NMOS transistor N22 has a gate for receiving the positive input signal VIN of the differential input signals VIN and VINB and a source-drain path between the output terminal VOUT and the second node ND22. The third NMOS transistor N23 has a gate for receiving the negative input signal VINB of the differential input signals VIN and VINB and a source-drain path between the first node ND21 and the second node ND22. Threshold voltages of the second NMOS transistor N22 and the third NMOS transistor N23, which constitute the first differential input section 316, may be the same as the first threshold value V1.

The PMOS type folded-cascode amplification unit 320 includes a first sourcing section 322 for sourcing/supplying a third bias current ICS_P, a second sinking section 324 for sinking/grounding a fourth bias current 2xICAS, a second differential input section 326 provided between the first sourcing section 322 and the second sinking section 324 to receive the differential input signals VIN and VINB, and a common gate amplification element 328 cascode-coupled to the common loading section 312 of the NMOS type amplification unit 310. The PMOS type folded-cascode amplification unit 320 may further include the common loading section 312 shared with the NMOS type amplification unit 310

The first sourcing section 322 includes a third PMOS transistor P23 having a gate for receiving a first bias signal VBIAS1 and a source-drain path between the supply voltage (VDD) terminal and a third node ND23.

The second sinking section 324 includes a fourth NMOS transistor N24 and a fifth NMOS transistor N25. The fourth NMOS transistor N24 has a gate for receiving a second bias signal VBIAS2 and a source-drain path between a fourth node ND24 and the ground voltage (VSS) terminal. The fifth NMOS transistor N25 has a gate for receiving the second bias signal VBIAS2 and a source-drain path between a fifth node ND25 and the ground voltage (VSS) terminal.

The second differential input section 326 includes a fourth PMOS transistor P24 and a fifth PMOS transistor P25. The fourth PMOS transistor P24 has a gate for receiving the positive input signal VIN of the differential input signals VIN and VINB and a source-drain path between the third node ND23 and the fifth node ND25. The fifth PMOS transistor P25 has a gate for receiving the negative input signal VINB of the differential input signals VIN and VINB and a source-drain path between the third node ND23 and the fourth node ND24. Threshold voltages of the fourth PMOS transistor P24 and the fifth PMOS transistor P25, which constitute the second differential input section 326, may be the same as the second threshold value V2.

The common gate amplification element 328 includes a sixth NMOS transistor N26 and a seventh NMOS transistor N27. The sixth NMOS transistor N26 has a source-drain path between the first node ND21 and the fourth node ND24. The seventh NMOS transistor N27 forms a common gate together with the sixth NMOS transistor N26 and has a source-drain path between the output terminal VOUT and the fifth node ND25. The common gate amplification element 328 having the above configuration is configured to block the voltage from the common loading section 312 while increasing the resistance of the common loading section 312.

The adaptive biasing unit 330 includes a first signal generation section 332, a second signal generation section 334, and a switching path 336. The first signal generation section 332 is configured to apply the first bias signal VBIAS1 to the first sourcing section 322 in response to the source bias signal VNCS. The second signal generation section 334 is configured to apply the second bias signal VBIAS2 to the second sinking section 324 in response to the first bias signal VBIAS1. The switching part 336 is configured to selectively apply the second bias signal VBIAS2 to the second sinking section 324 in response to the negative input signal VINB of the differential input signals.

The first signal generation section 332 includes an eighth NMOS transistor N28 and a sixth PMOS transistor P26. The eighth NMOS transistor N28 has a gate for receiving the source bias signal VNCS and a source-drain path between a sixth node ND26 and the ground voltage (VSS) terminal. The sixth PMOS transistor P26 has a gate coupled to the sixth node ND26 and a source-drain path between the supply voltage (VDD) terminal and the sixth node ND26.

Figure 6:
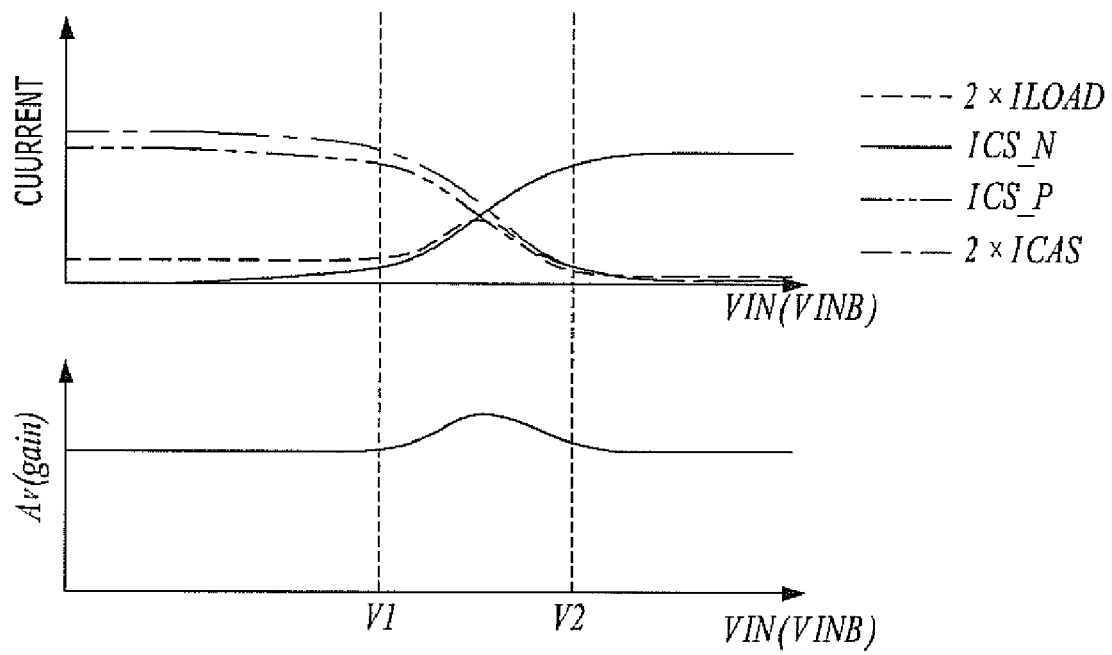
FIG. 6 is a graph illustrating the current-voltage characteristics and the voltage gain of the rail-to-rail amplifier of FIG. 5 according to the DC levels of differential input signals.

The second signal generation section 334 may include the switching part 336. That is, an eighth PMOS transistor P28 constituting the switching part 336 is provided between a seventh PMOS transistor P27 and a ninth NMOS transistor N29, which constitute the second signal generation section 334. According to an example, a threshold voltage of the eighth PMOS transistor P28 may be the same as or similar to the threshold voltages (e.g., the second threshold value V2) of the fourth PMOS transistor P24 and the fifth PMOS transistor P25. Here, in a domain in which the DC levels of the differential input signals VIN and VINB are higher than the second threshold value V2, the eighth PMOS transistor P28 receiving the DC levels of the differential input signal VINB may be turned off and interrupt a current flowing through the ninth NMOS transistor N29 so that the current ICAS flowing through the second sinking unit 324 is interrupted (as shown in FIG. 6) as well since the transistors of the second sinking section 324 and the ninth transistor N29 form current mirrors. In more detail, the seventh PMOS transistor P27 forms a current mirror together with the sixth PMOS transistor P26 and has a source-drain path between the supply voltage (VDD) terminal and a seventh node ND27. The ninth NMOS transistor N29 forms a current mirror together with the fourth NMOS transistor N24 and the fifth NMOS transistor N25 of the second sinking section 324 and has a source-drain path between an eighth node ND28 and the ground voltage (VSS) terminal.

The switching part 336 includes the eighth PMOS transistor P28 having a gate for receiving the negative input signal VINB and a source-drain path between the seventh node ND27 and the eighth node ND28. The switching part 336 is provided to control whether to apply the second bias signal VBIAS2, unlike the configuration of the conventional art.

Hereinafter, an operation of the rail-to-rail amplifier 300 of FIG. 5 in accordance with the embodiment of the present invention is described with reference to FIG. 6.

FIG. 6 is a graph illustrating the current-voltage characteristics and the voltage gain of the rail-to-rail amplifier 300 according to the DC levels of the differential input signals.

Referring to FIG. 6, when the DC levels of the differential input signals VIN and VINB are lower than the first threshold value V1 in an allowable input voltage range of the rail-to-rail amplifier 300, only the PMOS type folded-cascode amplification unit 320 performs the amplification operation. When the DC levels of the differential input signals VIN and VINB are higher than the first threshold value V1 and lower than the second threshold value V2 in the allowable range of the rail-to-rail amplifier 300, both the NMOS type amplification unit 310 and the PMOS type folded-cascode amplification unit 320 perform the amplification operation. When the DC levels of the differential input signals VIN and VINB are higher than the second threshold value V2 in the allowable range of the rail-to-rail amplifier 300, only the NMOS type amplification unit 310 performs the amplification operation.

Particularly, since the current path of the PMOS type folded-cascade amplification unit 320 is adjustably controlled according to the DC levels of the differential input signals VIN and VINB when the NMOS type amplification unit 310 performs the amplification operation, the voltage gain Av of the rail-to-rail amplifier 300 can be constantly maintained. This can be performed by using the relationship between the fourth bias current 2xICAS, the first bias current 2xILOAD and the third bias current ICS_P. When the fourth bias current 2xICAS maintains a constant value, the first bias current 2xILOAD and the third bias current ICS_P may be complementary to each other. Consequently, in order to constantly maintain the first bias current 2xILOAD when the third bias current ICS_P is reduced, the fourth bias current 2xICAS may be controlled to be reduced according to the reduction of the third bias current ICS_P.

In accordance with the embodiment of the present invention, the current path of the PMOS type folded-cascode amplification unit 320 is flexibly interrupted according to the DC levels of the differential input signals VIN and VINB, so that the voltage gain Av of the rail-to-rail amplifier 300 may be constantly maintained.

Figure 7:
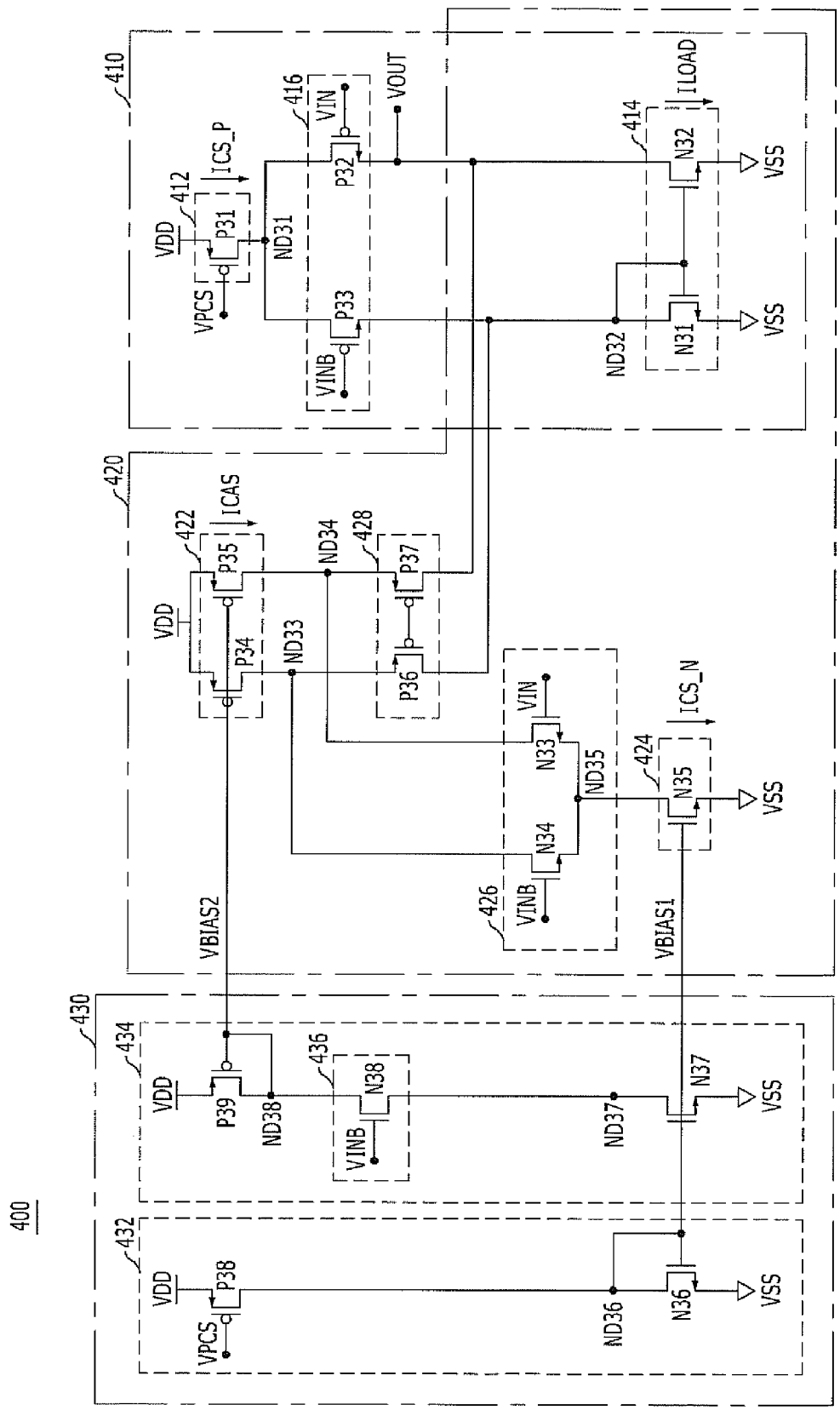
FIG. 7 is an internal circuit diagram of a rail-to-rail amplifier in accordance with another exemplary embodiment of the present invention.

FIG. 7 is an internal circuit diagram of a rail-to-rail amplifier in accordance with another exemplary embodiment of the present invention.

Referring to FIG. 7, the rail-to-rail amplifier 400 includes a PMOS type amplification unit 410, an NMOS type folded-cascode amplification unit 420, and an adaptive biasing unit 430. The PMOS type amplification unit 410 is configured to receive differential input signals VIN and VINB and perform an amplification operation in a domain in which the DC levels of the differential input signals VIN and VINB are lower than a first threshold value V1. The NMOS type folded-cascode amplification unit 420 is configured to receive the differential input signals VIN and VINB and perform an amplification operation in a domain in which the DC levels of the differential input signals VIN and VINB are higher than a second threshold value V2 which is lower than the first threshold value V1. The NMOS type folded-cascode amplification unit 420 is cascade-coupled to the PMOS type amplification unit 410. The adaptive biasing unit 430 is configured to interrupt/block a current path of the NMOS type folded-cascode amplification unit 420 in a domain in which the DC levels of the differential input signals VIN and VINB are lower than the second threshold value V2 in response to the differential input signals VIN and VINB.

The PMOS type amplification unit 410 includes a first sourcing section 412 for sourcing/supplying a first bias current ICS_P in response to a source bias signal VPCS, a common loading section 414 for sinking/grounding a second bias current 2xILOAD, and a first differential input section 416 provided between the first sourcing section 412 and the common loading section 414 to receive the differential input signals VIN and VINB.

The first sourcing section 412 includes a first PMOS transistor P31 which has a gate for receiving the source bias signal VPCS and a source-drain path between a supply voltage (VDD) terminal and a first node ND31.

The common loading section 414 includes first and second NMOS transistors N31 and N32 forming a current mirror. In detail, the first NMOS transistor N31 has a gate coupled to a second node ND32 and a source-drain path between the second node ND32 and a ground voltage (VSS) terminal. The second NMOS transistor N32 forms a common gate together with the first NMOS transistor N31 and has a source-drain path between an output terminal VOUT and the ground voltage (VSS) terminal.

The first differential input section 416 includes a second PMOS transistor P32 and a third PMOS transistor P33. The second PMOS transistor P32 has a gate for receiving the positive input signal VIN of the differential input signals VIN and VINB and a source-drain path between the first node ND31 and the output terminal VOUT. The third PMOS transistor P33 has a gate for receiving the negative input signal VINB of the differential input signals VIN and VINB and a source-drain path between the first node ND31 and the second node ND32. Threshold voltages of the second PMOS transistor P32 and the third PMOS transistor P33, which constitute the first differential input section 416, may be the same as the first threshold value V1.

The NMOS type folded-cascode amplification unit 420 includes a second sourcing section 422 for sourcing/supplying a third bias current 2xICAS, a first sinking section 424 for sinking/grounding a fourth bias current ICS_N, a second differential input section 426 provided between the second sourcing section 422 and the first sinking section 424 to receive the differential input signals VIN and VINB, and a common gate amplification element 428 cascode-coupled to the common loading section 414 of the PMOS type amplification unit 410. The NMOS type folded-cascode amplification unit 420 may further include the common loading section 414 shared with the PMOS type amplification unit 410.

The second sourcing section 422 includes a fourth PMOS transistor P34 and a fifth PMOS transistor P35. The fourth PMOS transistor P34 has a gate for receiving a second bias signal VBIAS2 and a source-drain path between the supply voltage (VDD) terminal and a third node ND33. The fifth PMOS transistor P35 has a gate for receiving the second bias signal VBIAS2 and a source-drain path between the supply voltage (VDD) terminal and a fourth node ND34.

The first sinking section 424 includes a fifth NMOS transistor N35 having a gate for receiving a first bias signal VBIAS1 and a source-drain path between a fifth node ND35 and the ground voltage (VSS) terminal.

The second differential input section 426 includes a third NMOS transistor N33 and a fourth NMOS transistor N34. The third NMOS transistor N33 has a gate for receiving the positive input signal VIN of the differential input signals VIN and VINB and a source-drain path between the fourth node ND34 and the fifth node ND35. The fourth NMOS transistor N34 has a gate for receiving the negative input signal VINB of the differential input signals VIN and VINB and a source-drain path between the third node ND33 and the fifth node ND35. Threshold voltages of the third NMOS transistor N33 and the fourth NMOS transistor N34, which constitute the second differential input section 426, may be the same as the second threshold value V2.

The common gate amplification element 428 includes a sixth PMOS transistor P36 and a seventh PMOS transistor P37. The sixth PMOS transistor P36 has a source-drain path between the third node ND33 and the second node ND32. The seventh PMOS transistor P37 forms a common gate together with the sixth PMOS transistor P36 and has a source-drain path between the fourth node ND34 and the output terminal VOUT. The common gate amplification element 428 having the above configuration is configured to block the voltage from the common loading section 414 while increasing the resistance of the common loading section 414.

The adaptive biasing unit 430 includes a first signal generation section 432 and a second signal generation section 434. The first signal generation section 432 is configured to apply the first bias signal VBIAS1 to the first sinking section 424 in response to the source bias signal VPCS. The second signal generation section 434 is configured to apply the second bias signal VBIAS2 to the second sourcing section 422 in response to the first bias signal VBIAS1.

The first signal generation section 432 includes an eighth PMOS transistor P38 and a sixth NMOS transistor N36. The eighth PMOS transistor P38 has a gate for receiving the source bias signal VPCS and a source-drain path between the supply voltage (VDD) terminal and a sixth node ND36. The sixth NMOS transistor N36 has a gate coupled to the sixth node ND36 and a source-drain path between the sixth node ND36 and the ground voltage (VSS) terminal.

Figure 8:
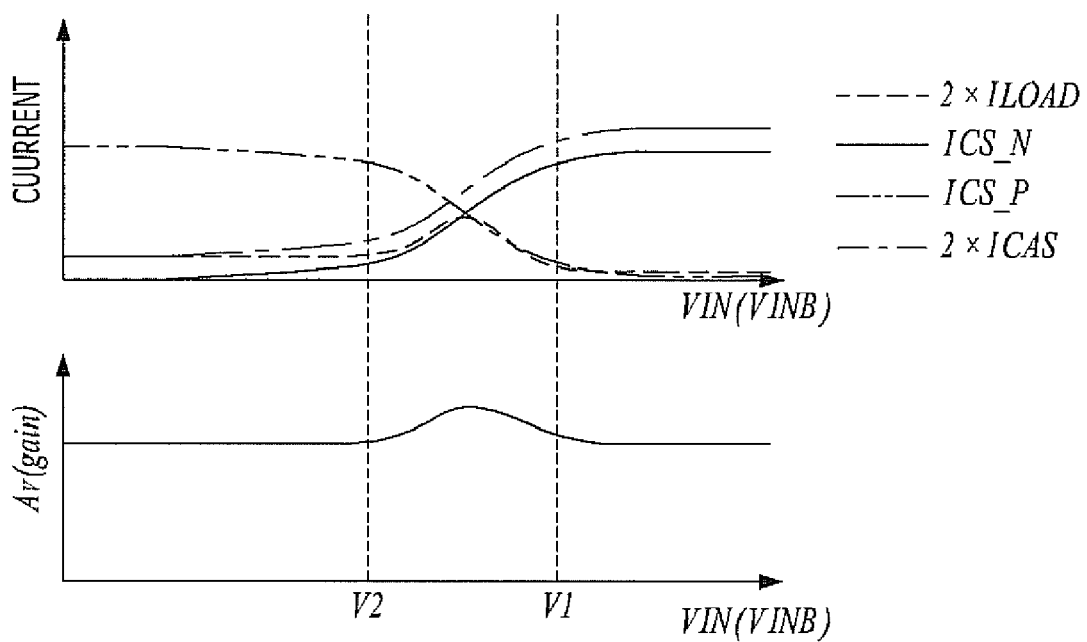
FIG. 8 is a graph illustrating the current-voltage characteristics and the voltage gain of the rail-to-rail amplifier of FIG. 7 according to the DC levels of differential input signals.

The second signal generation section 434 may includes a switching part 436. That is, an eighth NMOS transistor N38 constituting the switching part 436 is provided between a seventh NMOS transistor N37 and a ninth PMOS transistor P39 to constitute the second signal generation section 434. According to an example, a threshold voltage of the eighth NMOS transistor N38 may be same as or similar to the threshold voltages (e.g., the second threshold value V2) of the third NMOS transistor N33 and the fourth NMOS transistor N34. Here, in a domain in which the DC levels of the differential input signal VIN and VINB are lower than the second threshold value V2, the eighth NMOS transistor N38 receiving the DC levels of the differential input signal VINB may be turned off and interrupt a current flowing through the ninth PMOS transistor P39 so that the current ICAS flowing through the second sourcing section 422 is interrupted (as shown in FIG. 8) as well since the transistors of the second sourcing section 422 and the ninth PMOS transistor P39 form current mirrors. In more detail, the seventh NMOS transistor N37 forms a current mirror together with the sixth NMOS transistor N36 and has a source-drain path between a seventh node ND37 and the ground voltage (VSS) terminal. The ninth PMOS transistor P39 forms a current mirror together with the fourth PMOS transistor P34 and the fifth PMOS transistor P35 of the second sourcing section 422 and has a source-drain path between the supply voltage (VDD) terminal and an eighth node ND38.

The switching part 436 includes the eighth NMOS transistor N38 having a gate for receiving the negative input signal VINB and a source-drain path between the seventh node ND37 and the eighth node ND38. The switching part 436 is provided to control whether to apply the second bias signal VBIAS2, unlike the configuration of the conventional art.

Hereinafter, the operation of the rail-to-rail amplifier 400 of FIG. 7 in accordance with the embodiment of the present invention is described with reference to FIG. 8.

FIG. 8 is a graph illustrating the current-voltage characteristics and the voltage gain of the rail-to-rail amplifier 400 according to the DC levels of the differential input signals.

Referring to FIG. 8, when the DC levels of the differential input signals VIN and VINB are higher than the first threshold value V1 in an allowable input voltage range of the rail-to-rail amplifier 400, only the NMOS type folded-cascode amplification unit 420 performs the amplification operation. When the DC levels of the differential input signals VIN and VINB are between the first threshold value V1 and the second threshold value V2 in the allowable range of the rail-to-rail amplifier 400, both the PMOS type amplification unit 410 and the NMOS type folded-cascode amplification unit 420 perform the amplification operation. When the DC levels of the differential input signals VIN and VINB are lower than the second threshold value V2 in the allowable range of the rail-to-rail amplifier 400, for example, only the PMOS type amplification unit 410 performs the amplification operation.

Particularly, since it can flexibly control whether to interrupt the current path of the NMOS type folded-cascode amplification unit 420 according to the DC levels of the differential input signals VIN and VINB when the PMOS type amplification unit 410 performs the amplification operation, the voltage gain Av of the rail-to-rail amplifier 400 can be constantly maintained. This may be performed by adjusting the amount of the third bias current 2xICAS according to the fourth bias current ICS_N.

In accordance with the embodiment of the present invention, the current path of the NMOS type folded-cascode amplification unit 420 is flexibly interrupted according to the DC levels of the differential input signals VIN and VINB, so that the voltage gain Av of the rail-to-rail amplifier 400 may be constantly maintained.

In accordance with the exemplary embodiment of the present invention, a current path is interrupted based on the DC levels of differential input signals, so that formation of an undesired current path may be prevented and a voltage gain may be constantly maintained.

While the present invention has been described with respect to the specific embodiments, it will be apparent to those skilled in the art that various changes and modifications may be made without departing from the spirit and scope of the invention as defined in the following claims.

What is claimed is:

1. A rail-to-rail amplifier comprising:
a first amplification unit configured to perform an amplification operation on differential input signals in a domain in which DC levels of the differential input signals are higher than a first threshold value;
a second amplification unit configured to perform an amplification operation on the differential input signals in a domain in which the DC levels of the differential input signals are lower than a second threshold value which is higher than the first threshold value, the second amplification unit being cascade-coupled to the first amplification unit; and
an adaptive biasing unit configured to interrupt a current path of the second amplification unit in a domain in which the DC levels of the differential input signals are higher than the second threshold value,
wherein the first and second amplification units are configured to simultaneously perform the respective amplification operations in a domain in which the DC levels of the differential input signals are higher than the first threshold value but lower than the second threshold value.

2. The rail-to-rail amplifier of claim 1, wherein the differential input signals are small signals with a small amplitude and have a common mode voltage level as the DC level.

3. The rail-to-rail amplifier of claim 1, wherein the first and second amplification units share one loading section.

4. The rail-to-rail amplifier of claim 1, wherein the first amplification unit includes an NMOS type amplification unit and the second amplification unit includes a PMOS type folded-cascade amplification unit.

5. The rail-to-rail amplifier of claim 4, wherein the NMOS type amplification unit comprises:
a common loading section configured to source a first bias current;
a first sinking section configured to sink a second bias current in response to a source bias signal; and
a first differential input section provided between the common loading section and the first sinking section to receive the differential input signals.

6. The rail-to-rail amplifier of claim 5, wherein the PMOS type folded-cascade amplification unit comprise:
a first sourcing section configured to source a third bias current;
a second sinking section configured to sink a fourth bias current; and
a second differential input section provided between the first sourcing section and the second sinking section to receive the differential input signals,
wherein a first node and a second node between the common loading section and the first differential input section are respectively connected to a third node and a fourth node between the second differential input section and the second sinking section so that the NMOS type amplification unit and the PMOS type folded-cascode amplification unit share the common loading section.

7. The rail-to-rail amplifier of claim 6, wherein the adaptive biasing unit configured to apply a first bias signal for enabling the first sourcing section to the first sourcing section, and selectively apply a second bias signal for enabling the second sinking section to the second sinking section in response to one of the differential input signals.

8. The rail-to-rail amplifier of claim 6, further comprising a common gate amplification element provided between the first node/the second node and the third node/the fourth node.

9. The rail-to-rail amplifier of claim 7, wherein the adaptive biasing unit comprises:
a first signal generation unit configured to apply the first bias signal to the first sourcing section in response to the source bias signal;
a second signal generation unit configured to apply the second bias signal to the second sinking section in response to the first bias signal and; and
a switching part configured to control the second signal generation unit to selectively apply the second bias signal to the second sinking section in response to one of the differential input signals.

10. The rail-to-rail amplifier of claim 9, wherein the first signal generation unit comprises:
a third sinking section configured to sink a fifth bias current in response to the source bias signal; and
a second sourcing section configured to form a current mirror together with the first sourcing section and source the third bias current.

11. The rail-to-rail amplifier of claim 10, wherein the second signal generation unit comprises:
a third sourcing section configured to form a current mirror together with the second sourcing section and source the third bias current; and
a fourth sinking section configured to form a current mirror together with the second sinking section and sink the fourth bias current,
wherein the switching part is provided between the third sourcing section and the fourth sinking section.

12. A rail-to-rail amplifier comprising:
a first amplification unit configured to perform an amplification operation on differential input signals in a domain in which DC levels of the differential input signals are lower than a first threshold value;
a second amplification unit configured to perform an amplification operation on the differential input signals in a domain in which the DC levels of the differential input signals are higher than a second threshold value which is lower than the first threshold value, the second amplification unit being cascade-coupled to the first amplification unit; and
an adaptive biasing unit configured to interrupt a current path of the second amplification unit in a domain in which the DC levels of the differential input signals are lower than the second threshold value,
wherein the first and second amplification units are configured to simultaneously perform the respective amplification operations in a domain in which the DC levels of the differential input signals are lower than the first threshold value but higher than the second threshold value.

13. The rail-to-rail amplifier of claim 12, wherein the differential input signals are small signals with a small amplitude and have a common mode voltage level as the DC level.

14. The rail-to-rail amplifier of claim 12, wherein the first and second amplification units share one loading section.

15. The rail-to-rail amplifier of claim 12, wherein the first amplification unit includes a PMOS type amplification unit and the second amplification units includes an NMOS type folded-cascade amplification.

16. The rail-to-rail amplifier of claim 15, wherein the PMOS type amplification unit comprises:
a first sourcing section configured to source a first bias current in response to a source bias signal;
a common loading section configured to sink a second bias current; and a first differential input section provided between the common loading section and the first sourcing section to receive the differential input signals.

17. The rail-to-rail amplifier of claim 16, wherein the NMOS type folded-cascode amplification unit comprise:
    a second sourcing section configured to source a third bias current;
    a first sinking section configured to a fourth bias current; and
    a second differential input section provided between the second sourcing section and the first sinking section to receive the differential input signals,
    wherein a first node and a second node between the common loading section and the first differential input section are respectively connected to a third node and a fourth node between the second sourcing section and the second differential input section so that the PMOS type amplification unit and the NMOS type folded-cascode amplification unit share the common loading section.

18. The rail-to-rail amplifier of claim 17, wherein the adaptive biasing unit configured to apply a first bias signal for enabling the first sinking section to the first sinking section, and selectively apply a second bias signal for enabling the second sourcing section to the second sourcing section in response to one of the differential input signals.

19. The rail-to-rail amplifier of claim 17, further comprising a common gate amplification element provided between the first node/the second node and the third node/the fourth node.

20. The rail-to-rail amplifier of claim 18, wherein the adaptive biasing unit comprises:
    a first signal generation unit configured to apply the first bias signal to the first sinking section in response to the source bias signal;
    a second signal generation unit configured to apply the second bias signal to the second sourcing section in response to the first bias signal; and
    a switching part configured to control the second signal generation unit to selectively apply the second bias signal to the second sourcing section in response to one of the differential input signals.

21. The rail-to-rail amplifier of claim 20, wherein the first signal generation unit comprises:
    a third sourcing section configured to source a fifth bias current in response to the source bias signal; and
    a second sinking section configured to form a current mirror together with the first sinking section and sink the fourth bias current.

22. The rail-to-rail amplifier of claim 21, wherein the second signal generation unit comprises:
    a third sinking section configured to form a current mirror together with the second sinking section and sink the fourth bias current; and
    a fourth sourcing section configured to form a current mirror together with the second sourcing section and source the third bias current,
    wherein the switching part is provided between the third sinking section and the fourth sourcing section.

* * * * *